United States Patent
Lin et al.

(10) Patent No.: US 6,788,499 B2
(45) Date of Patent: Sep. 7, 2004

(54) SPIN VALVE SENSOR WITH INSULATING AND CONDUCTIVE SEED LAYERS

(75) Inventors: Tsann Lin, Saratoga, CA (US); Daniele Mauri, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/441,692

(22) Filed: May 19, 2003

(65) Prior Publication Data

US 2003/0205459 A1 Nov. 6, 2003

Related U.S. Application Data

(60) Division of application No. 10/219,410, filed on Aug. 14, 2002, now Pat. No. 6,592,725, which is a division of application No. 09/733,876, filed on Dec. 8, 2000, now Pat. No. 6,521,098, which is a continuation-in-part of application No. 09/652,767, filed on Aug. 31, 2000, now abandoned.

(51) Int. Cl.⁷ .......................... G11B 5/127; G11B 5/39; G11B 5/33
(52) U.S. Cl. ................................... 360/324.1
(58) Field of Search ................ 360/324.1, 324.12, 360/324.11, 324, 313, 110

(56) References Cited

U.S. PATENT DOCUMENTS

| | | | |
|---|---|---|---|
| 5,292,393 A | 3/1994 | Maydan et al. | 156/345.32 |
| 5,955,211 A | 9/1999 | Maeda et al. | 428/692 |
| 6,141,191 A | 10/2000 | Lee et al. | 360/324.1 |
| 6,185,081 B1 | 2/2001 | Simion et al. | 360/327.3 |
| 6,208,492 B1 | 3/2001 | Pinarbasi | 360/324.11 |
| 6,262,869 B1 | 7/2001 | Lin et al. | 360/324.11 |
| 6,275,362 B1 * | 8/2001 | Pinarbasi | 360/324.12 |
| 6,306,266 B1 | 10/2001 | Metin et al. | 204/192.12 |
| 6,317,299 B1 | 11/2001 | Pinarbasi | 360/324.11 |
| 6,398,924 B1 | 6/2002 | Pinarbasi | 204/192.2 |
| 6,404,606 B1 | 6/2002 | Pinarbasi | 360/324.11 |
| 6,411,476 B1 | 6/2002 | Lin et al. | 360/324.11 |
| 6,433,972 B1 | 8/2002 | Mao et al. | 360/324.11 |
| 6,452,763 B1 | 9/2002 | Gill | 360/324.11 |
| 6,490,140 B1 | 12/2002 | Mao et al. | 360/324.11 |
| 6,501,626 B1 * | 12/2002 | Gill | 360/324.11 |

* cited by examiner

*Primary Examiner*—Julie Anne Watko
(74) *Attorney, Agent, or Firm*—Blakely Sokoloff Taylor & Zafman; William D. Gill

(57) ABSTRACT

A spin valve sensor with insulating and conductive seed layers is provided. The sensor comprising $Al_2O_3$/Ni—Cr—Fe/Ni—Fe/Co—Fe/Cu/Co—Fe/Ru/Co—Fe/Pt—Mn films is formed by depositing an insulating $Al_2O_3$ seed layer in a first chamber by reactively pulsed DC magnetron sputtering, depositing a conducting Ni—Cr—Fe seed layer and a ferromagnetic Ni—Fe free layer in a second chamber by ion beam sputtering, and then forming the remainder of the spin valve sensor in a third chamber by DC magnetron sputtering.

3 Claims, 17 Drawing Sheets

SPIN VALVE SENSOR WITH INSULATING AND CONDUCTIVE SEED LAYERS

The present application is a Divisional of a Divisional application filed on Aug. 14, 2002, and assigned application Ser. No. 10/219,410 (now U.S. Pat. No. 6,592,725), which is a Divisional of a Nonprovisional application filed on Dec. 8, 2000, and assigned application Ser. No. 09/733,876(now U.S. Pat. No. 6,521,098), which is a Continuation-In-Part of a Nonprovisional application filed on Aug. 31, 2000, and assigned application Ser. No. 09/652,767 (now abandoned).

FIELD OF THE INVENTION

The field of invention relates to giant magnetoresistance (GMR) head technology generally; and more specifically, to techniques that may be used to forming high read sensitivity heads via seed layer processing.

BACKGROUND

Hardware systems often include memory storage devices having media on which data can be written to and read from. A direct access storage device (DASD or disk drive) incorporating rotating magnetic disks are commonly used for storing data in a magnetic form. Magnetic heads, when writing data, record concentric, radially spaced information tracks on the rotating disks.

Magnetic heads also typically include read sensors that read data from the tracks on the disk surfaces. In high capacity disk drives, magnetoresistive (MR) read sensors, the defining structure of MR heads, can read stored data at higher linear densities than thin film heads. An MR head detects the magnetic field(s) through the change in resistance of its MR sensor. The resistance of the MR sensor changes as a function of the strength of magnetic fields that emanates from the rotating disk.

One type of MR sensor, referred to as a giant magnetoresistance (GMR) sensor, takes advantage of the GMR effect. In the GMR sensor, the resistance of the GMR sensor varies with the strength of magnetic fields from the rotating disk and as a function of the spin dependent transmission of conducting electrons between ferromagnetic layers separated by a nonmagnetic layer (commonly referred to as a spacer layer) and the accompanying spin dependent scattering within the ferromagnetic layers that takes place at the interface of the magnetic and nonmagnetic layers.

GMR sensors using two layers of ferromagnetic material separated by a layer of GMR promoting nonmagnetic material (the spacer layer) are generally referred to as spin valve (SV) sensors. In an SV sensor, one of the ferromagnetic layers, referred to as the pinned layer, has its magnetization "pinned" via the influence of exchange coupling to an antiferromagnetic layer. Due to the relatively high unidirectional anisotropy field ($H_{UA}$) associated with the pinned layer, the magnetization of the pinned layer typically does not rotate with respect to the magnetic flux lines that emanate/terminate from/to the rotating disk. The magnetization of the other ferromagnetic layer (commonly referred to as a ferromagnetic free layer), however, is free to rotate with respect to the magnetic flux lines that emanate/terminate from/to the rotating disk.

FIG. 1 shows a prior art SV sensor 100 comprising a seed layer 102 formed upon a gap layer 101. The seed layer 102 helps form properly microstructures of the layers formed thereon. Over seed layer 102 is a ferromagnetic free layer 103. An antiferromagnetic (AFM) layer 105 is used to pin the magnetization of the pinned layer 104. Pinned layer 104 is separated from ferromagnetic free layer 103 by the nonmagnetic, GMR promoting, spacer layer 119. Note that the ferromagnetic free layer 103 may have a multilayered structure with two or more ferromagnetic layers.

FIG. 2 shows another prior art SV sensor 200 where the pinned layer is implemented as a structure 220 having two ferromagnetic films 221, 222 (also referred to as AP2 and AP1 layers, respectively) separated by a nonmagnetic film 223 (such as ruthenium Ru) that provides antiparallel (AP) exchange coupling of the two ferromagnetic films 221, 222. The spin valve sensor such as that 200 shown in FIG. 2 is referred to as a synthetic spin valve sensor in light of its synthetic structure based on the antiparallel exchange-coupling relationship between films 221, 222.

FIG. 2 shows a synthetic spin valve sensor 200 comprising a seed layer 202 formed upon a gap layer 201. The seed layer 202 helps form properly microstructures of the layers formed thereon. Over the seed layer 202 is a ferromagnetic free layer 203. An antiferromagnetic (AFM) layer 205 are used to pin the magnetization of the AP2 layer 221. An AP1 layer 222 is separated from the ferromagnetic free layer 203 by a spacer layer 204. Note that ferromagnetic free layer 203 may have a multilayered structure with two or more ferromagnetic layers.

Problems with forming the sensors 100, 200 shown in FIGS. 1 and 2 include forming the seed layer 102, 202 with a microstructure that suitably influences the microstructure of the AFM layer 105, 205 as well as the other layers. Since the microstructure of the AFM layer 105, 205 (in light of its material composition) as well as the microstructure of the other layers affect the GMR properties of the spin valve sensor, the quality of the read sensitivity of the spin valve sensor 100, 200 depends upon the techniques used to form the seed layer 102, 202.

SUMMARY OF INVENTION

A method is described comprising forming an insulating polycrystalline seed layer in a first chamber by reactively pulsed DC magnetron sputtering, then forming an insulating amorphous-like seed layer in a second chamber by reactively pulsed DC magnetron sputtering, then forming a conducting seed layer and a ferromagnetic free layer in a third chamber by ion beam sputtering, and then forming the remainder of a spin valve sensor through the antiferromagnetic layer in a fourth chamber by DC magnetron sputtering.

BRIEF DESCRIPTION OF THE DRAWINGS

The present invention is illustrated by way of example, and not limitation, in the Figures of the accompanying drawings in which.

films. The seed layers are Ta(3), NiMnO$_x$(3), NiO(33)/Cu (1.4) and NiO(33)/NiMnO$_x$(3)/Cu(1.4) films.

Figure 8:
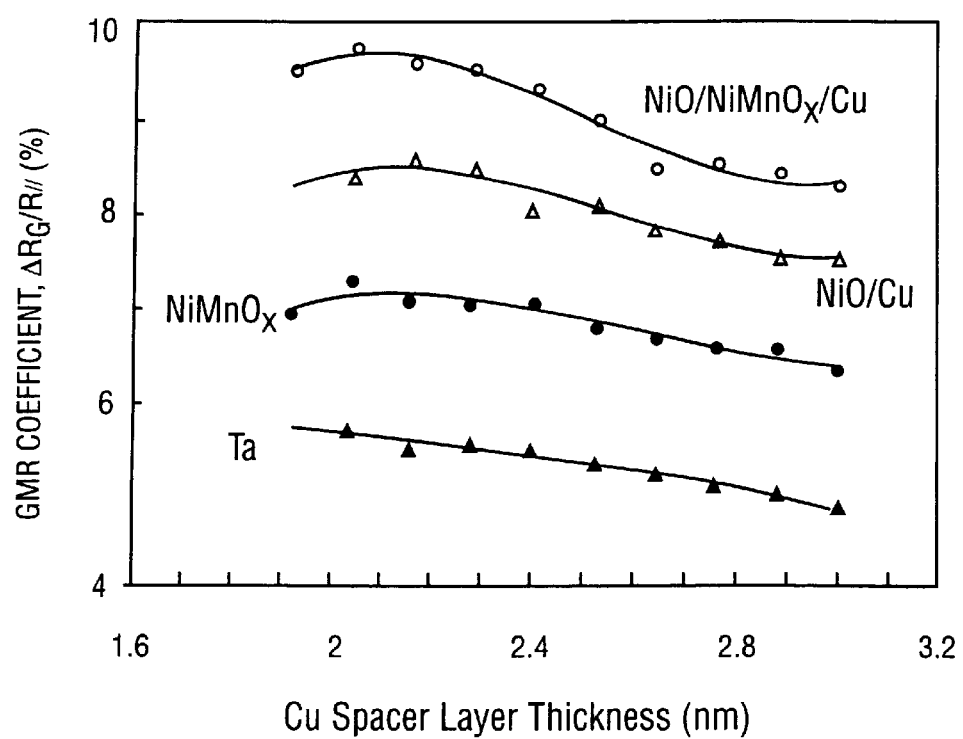

FIG. 8 shows $\Delta R_G/R_{//}$ vs. Cu spacer layer thickness for simple Ni—Mn spin valve sensors comprising seed layers/ Ni—Fe(4.5)/Co—Fe(0.6)/Cu(2.4)/Co(3.2)/Ni—Mn(25)/Ta (6) films. The seed layers are Ta(3), NiMnO$_x$(3), NiO(33)/ Cu(1.4) or NiO(33)/NiMnO$_x$(3)/Cu(1.4) films.

Figure 9:
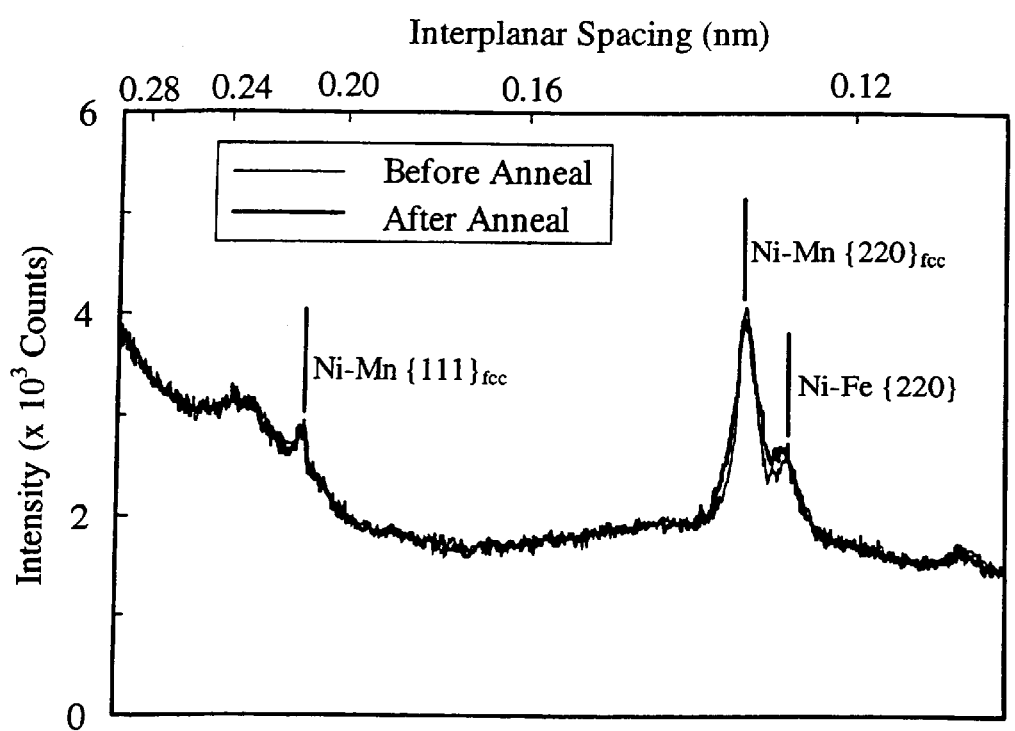

FIG. 9 shows in plane x-ray diffraction patterns of simple Ni—Mn spin valve sensors with Ta layers before and after anneal for 2 h at 280° C.

Figure 10:
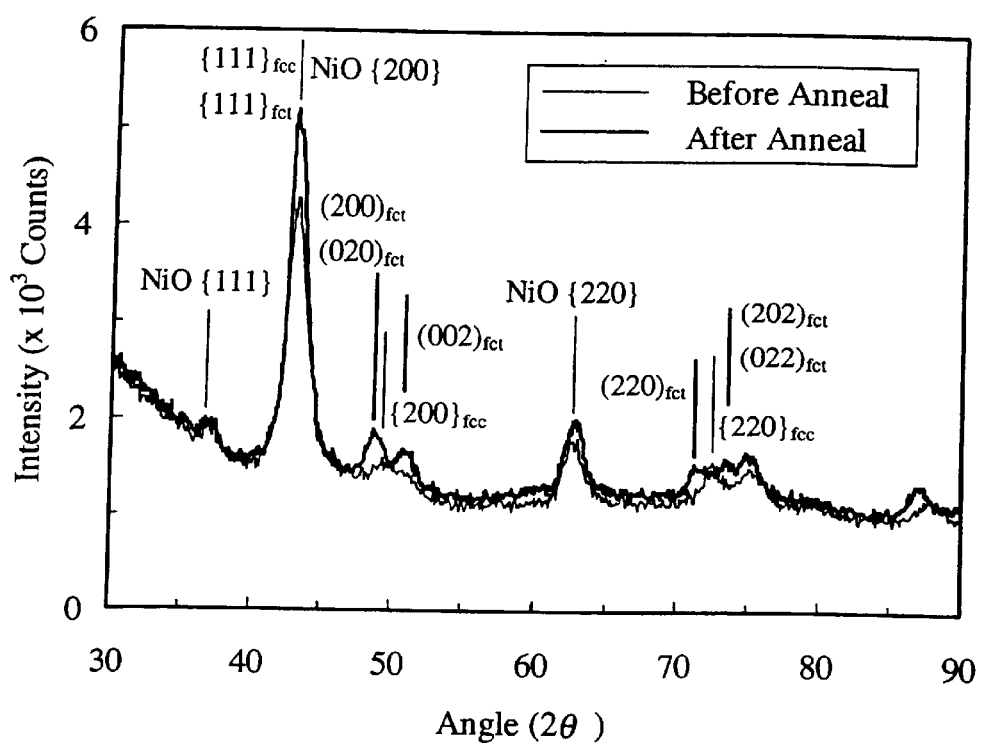

FIG. 10 shows in plane x-ray diffraction patterns of simple Ni—Mn spin valve sensors with NiO/NiMnO$_x$/Cu seed layers before and after anneal for 2 h at 280° C.

Figure 11:
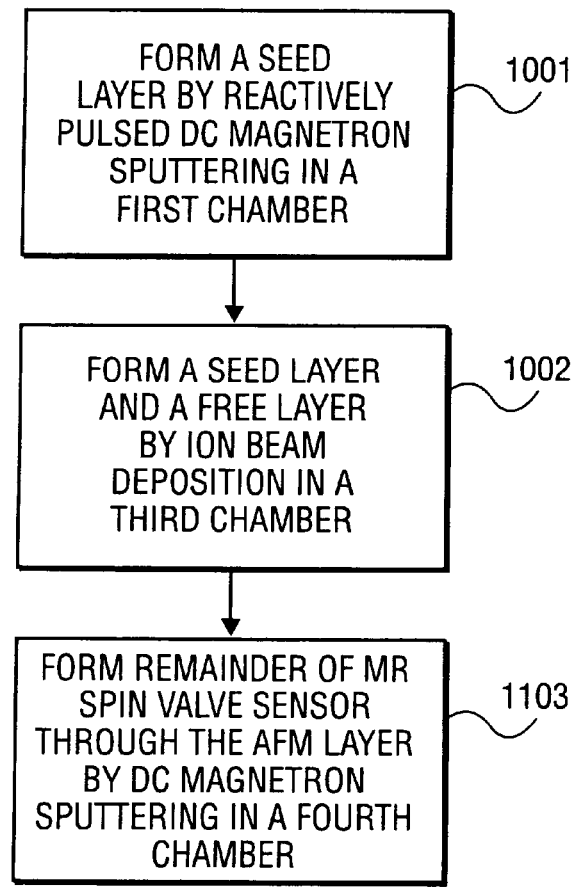

FIG. 11 shows a method 1000 that may be alternatively used to form spin valve sensors with a multilayered seed structure.

Figure 12:
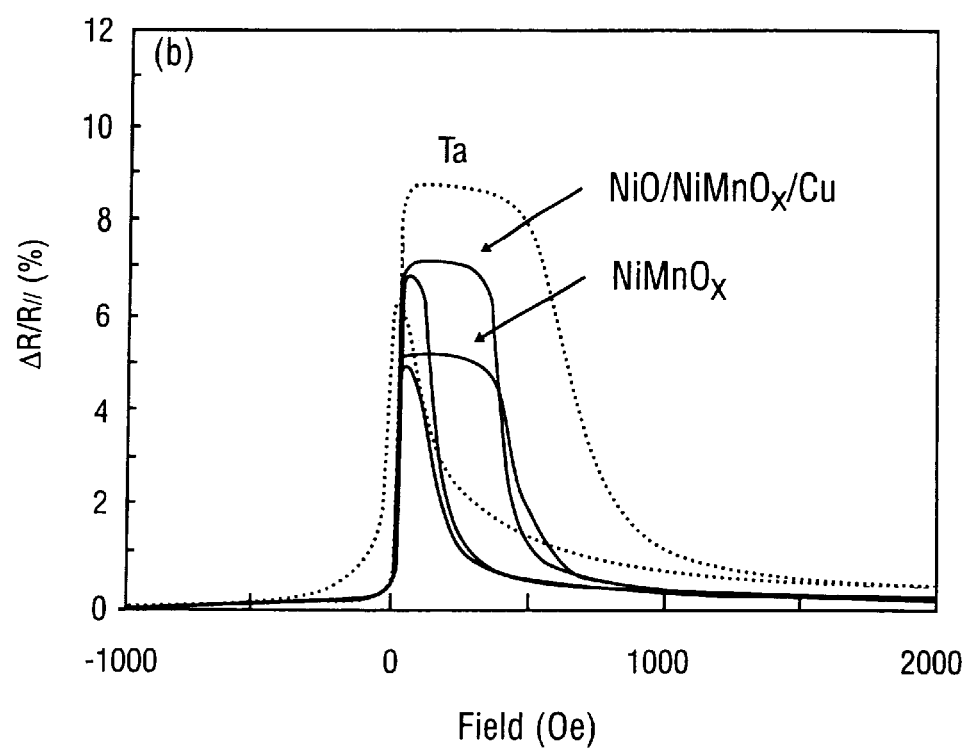

FIG. 12 shows MR responses of simple Pt—Mn spin valve sensors with various seed layers.

Figure 13:
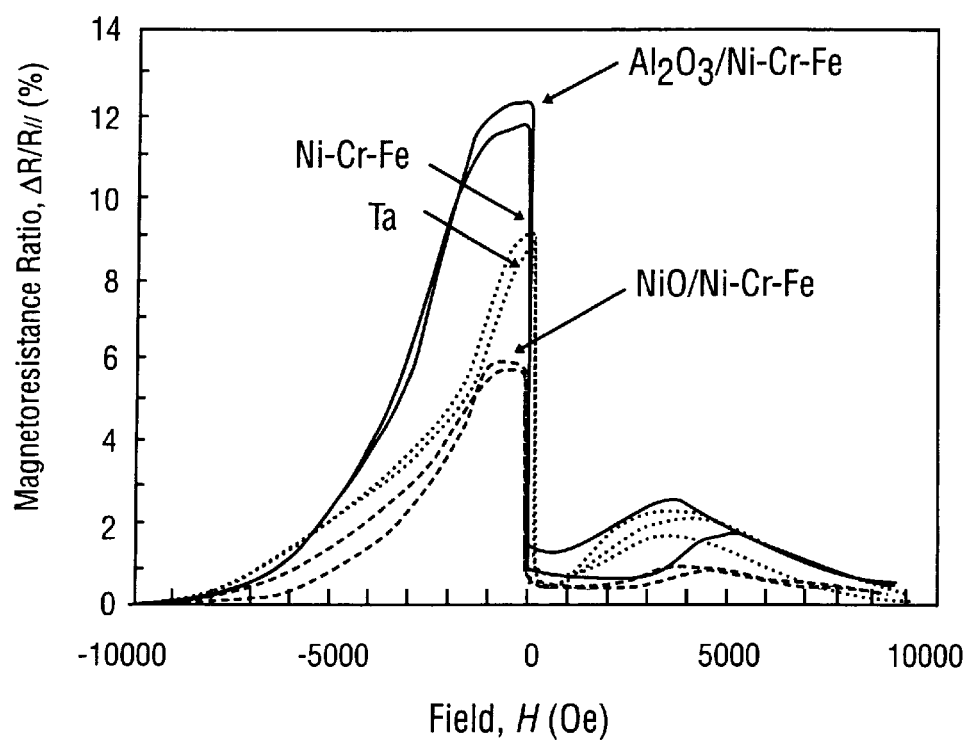

FIG. 13 shows MR responses of synthetic Pt—Mn spin valve sensors with various seed layers.

Figure 14:
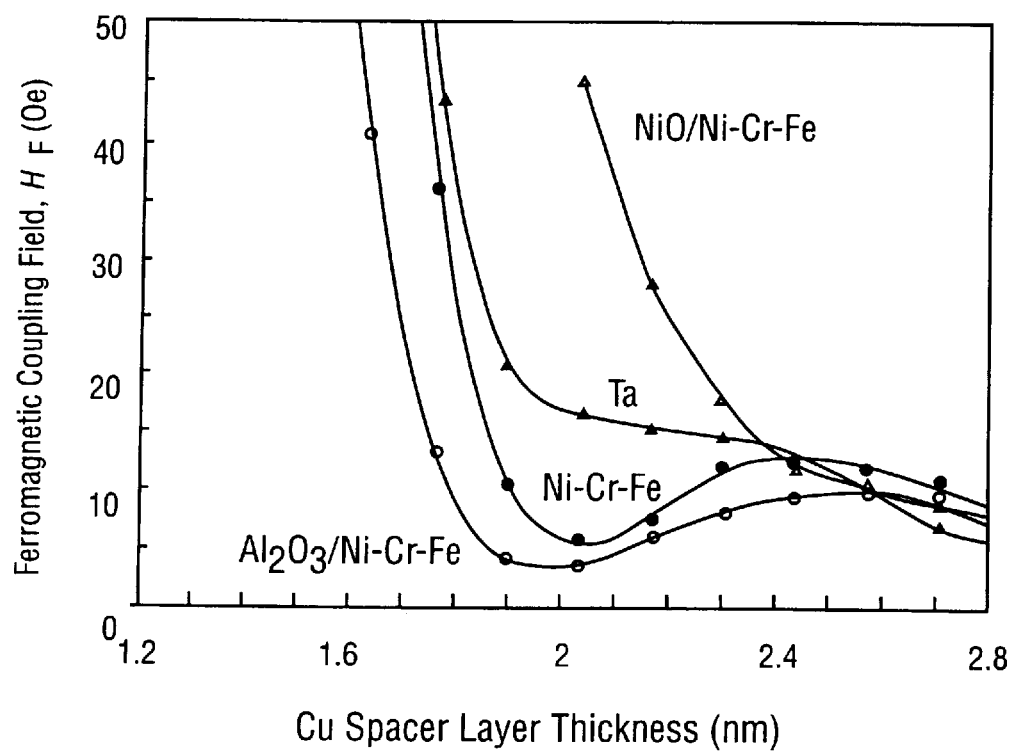

FIG. 14 shows $H_F$ vs. CU spacer layer thickness for synthetic Pt—Mn spin valve sensors comprising seed layers/ Ni—Fe(3)/Co—Fe(0.9)/Cu/Co—Fe(2.8)/Ru(0.8)/Co—Fe (2.4)/Pt—Mn(22.5)/Ta(6) films. The seed layers are Ta(3), Ni—Cr—Fe(3), NiO(3)/Ni—Cr—Fe(3) or Al$_2$O$_3$(3)/Ni—Fe—Cr(3) films.

Figure 15:
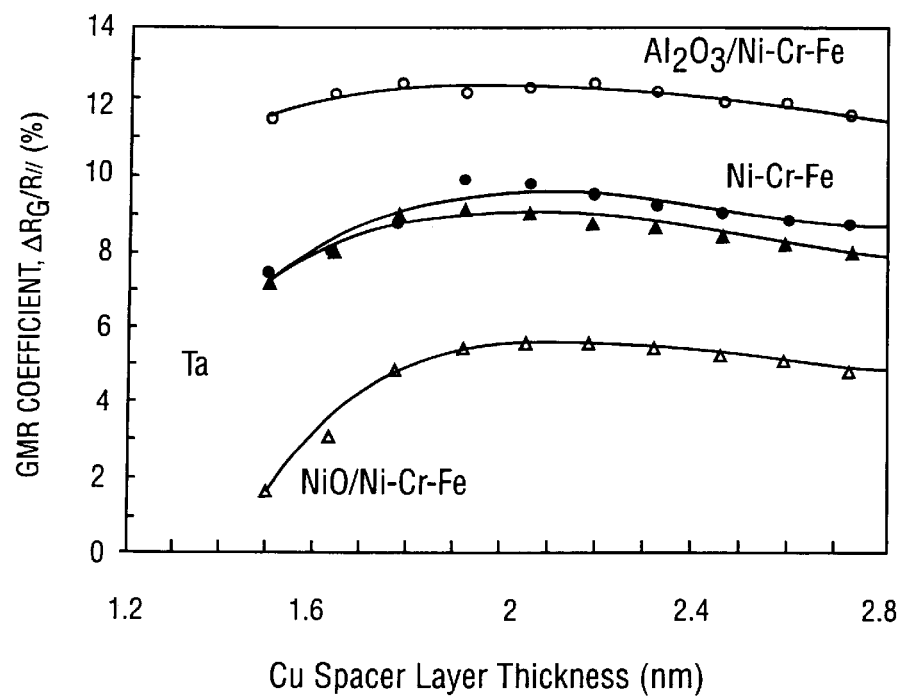

FIG. 15 shows $\Delta R_G/R_{//}$ vs. Cu spacer layer thickness for synthetic Pt—Mn spin valve sensors comprising seed layers/ Ni—Fe(3)/Co—Fe(0.9)/Cu/Co—Fe(2.8)/Ru(0.8)/Co—Fe (2.4)/Pt—Mn(22.5)/Ta(6) films. The seed layers are Ta(3), Ni—Cr—Fe(3), NiO(3)/Ni—Cr—Fe(3) or Al$_2$O$_3$(3)/Ni—Fe—Cr(3) films.

Figure 16:
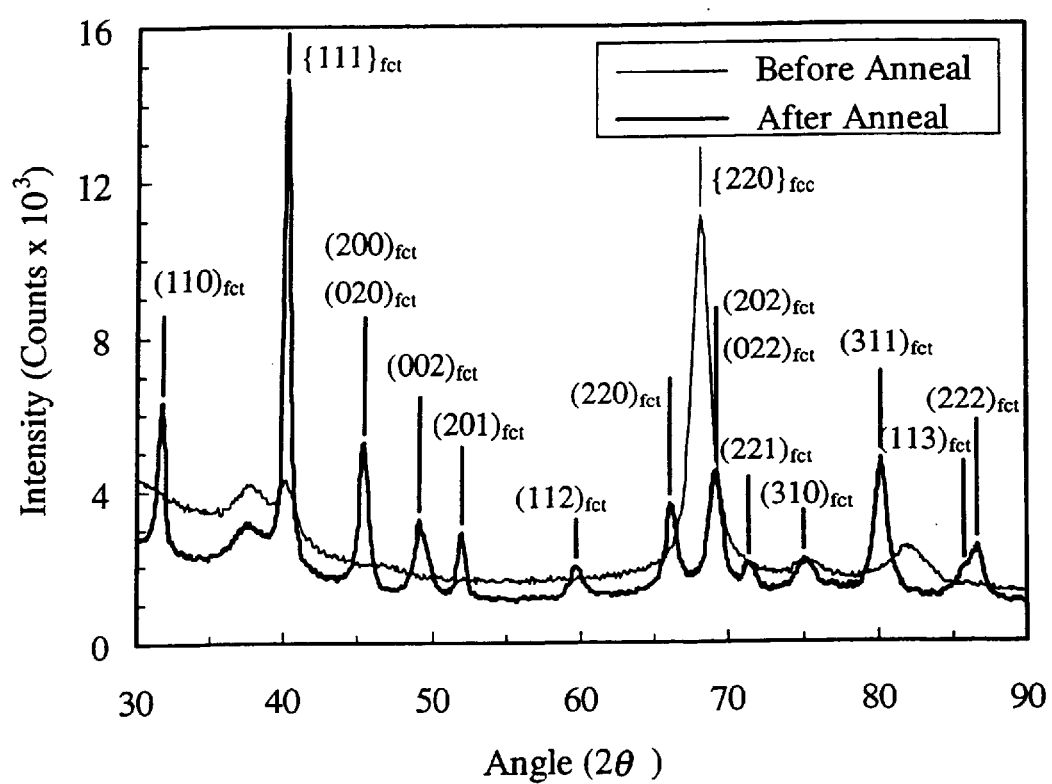

FIG. 16 shows in plane x-ray diffraction patterns of the synthetic Pt—Mn spin valve sensor with the Ta seed layer before and after anneal for 4 h at 260° C.

DETAILED DESCRIPTION

A method is described comprising forming an insulating polycrystalline seed layer in a first chamber by reactively pulsed DC magnetron sputtering, then forming an insulating amorphous-like seed layer in a second chamber by reactively pulsed DC magnetron sputtering, then forming a conducting seed layer and a ferromagnetic free layer in a third chamber by ion beam sputtering, and then forming the remainder of a spin valve sensor through the antiferromagnetic layer in a fourth chamber by DC magnetron sputtering.

These and other embodiments of the present invention may be realized in accordance with the following teachings and it should be evident that various modifications and changes may be made in the following teachings without departing from the broader spirit and scope of the invention. The specification and drawings are, accordingly, to be regarded in an illustrative rather than restrictive sense and the invention measured only in terms of the claims.

Sensors 100, 200 are impacted as disk storage systems continue to increase the density at which they store bits of information. As disks are configured to store increasing amounts of information, the strength of magnetic fields that emanate/terminate from/to the disk surface become weaker and weaker. In order to detect these weaker fields, sensors 100, 200 should be designed with enhanced read sensitivity at smaller dimensions.

Figure 1:
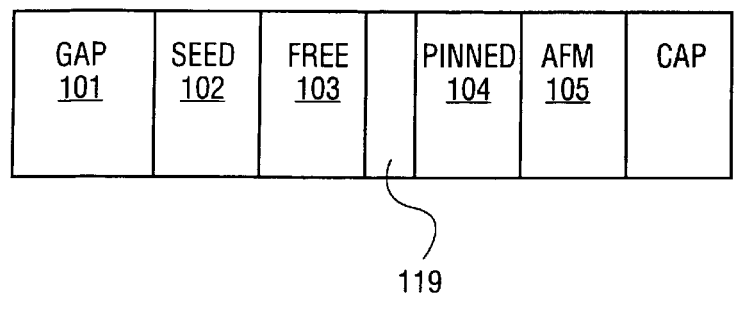
FIG. 1 shows a simple spin valve sensor (prior art).
Figure 1:
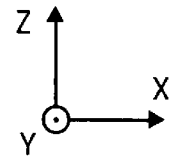
Figure 2:
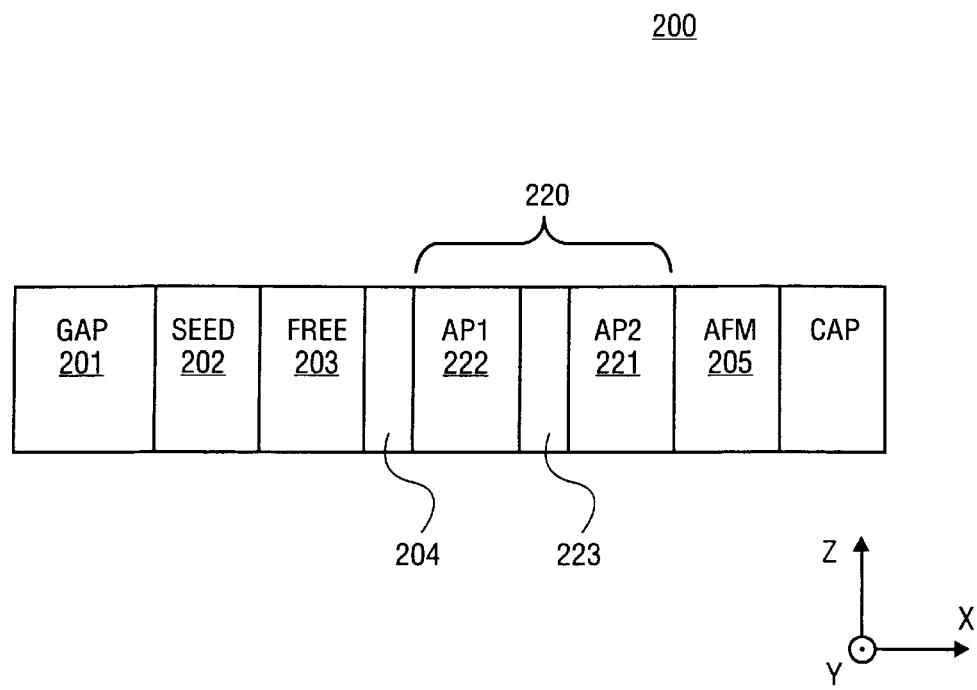
FIG. 2 shows a synthetic spin valve sensor (prior art).

Enhanced read sensitivity at a smaller dimension may be achieved by: 1) keeping the ferromagnetic exchange-coupling field $H_F$ between the ferromagnetic free layer 103, 203 and the pinned layers 104, 220 small (e.g., below 10 Oersteads (Oe)) so that the magnetization of the ferromagnetic free layer 103, 203 lies along the z axis as seen in FIGS. 1 and 2; 2) keeping the unidirectional anisotropy field ($H_{UA}$) between the pinned layer 102, 220 and the AFM layer 105, 205 high (e.g., above 600 Oe) so that the magnetization of the pinned layer 102, 220 lies along the y axis as seen in FIGS. 1 and 2; and 3) forming a spin valve sensor with a large giant magnetoresistive coefficient.

If the ferromagnetic exchange-coupling field $H_F$ between the ferromagnetic free layer 103, 203 and the pinned layers 102, 220 is too large, the magnetization of the ferromagnetic free layer will be adversely biased in a direction (e.g., having a + or −y direction component) that reduces the output signal swing of the spin valve sensor 100, 200. Similarly, if the unidirectional anisotropy field ($H_{UA}$) between the pinned layer 102, 220 and the AFM layer 105, 205 is too small, the magnetization of the pinned layer 102, 220 may also have an adverse bias in a direction (e.g., having a + or −z direction component) that also reduces sensor output signal swing. Reduced output signal swing from the spin valve sensor 100, 200 corresponds to reduced read sensitivity and is therefore undesirable for highly sensitive sensors.

Achieving a sufficiently small coupling field $H_F$ may be at least partially accomplished by controlling the microstructure of the free, spacer and pinned layers. Specifically, $H_F$ is reduced as the surface roughness of these layers decrease and the densities of these layers increase. Referring to FIGS. 1 and 2, the multilayered sensor structure 100, 200 is formed, layer by layer, in the +x direction. Thus, layer thickness and roughness are measured along the x axis. The density of a layer is measured by how tightly packed the grains of the layer are. Producing adequately smooth and adequately dense free, spacer and pinned layers allows $H_F$ to be tightly controlled and minimized.

A sufficiently large unidirectional anisotropy field ($H_{UA}$) is produced by forming the AFM layer with a face-centered-tetragonal (fct) phase. Materials used for the AFM layer 105, 205, such as Ni—Mn and Pt—Mn, are nonmagnetic if formed in a face-centered-cubic (fcc) phase. Since AFM layers 105, 205 are typically formed initially in a nonmagnetic fcc phase, the sensor is subsequently annealed to transform the phase of the AFM layer from a nonferromagnetic fcc phase to an antiferromagnetic fct phase.

It has been found, however, that the initial fcc orientation of the AFM layer 105, 205 affects the extent to which the AFM layer 105, 205 is able to transform to an fct phase. Specifically, {220} textured fcc Ni—Mn films are not easily annealed into an fct phase. An initial fcc texture of {200}, however, allows the Ni—Mn film 105, 205 to more easily transform into an fct phase.

The seed layer 102, 202 may be used to: 1) reduce the surface roughness of the sensor layers (to reduce $H_F$); and 2) induce a {200} fcc crystalline texture in the AFM layer 105, 205 so that the fcc phase may be more easily transformed into an fct phase during anneal. The crystalline structure of a layer formed upon another layer is influenced by the lower crystalline structure. Specifically, the upper layer tends to form with the crystalline structure of the lower layer. If the seed layer 102, 202 is formed with a {200} crystalline texture, the remaining layers atop the seed layer 102, 202, (including the AFM layer 105, 205) will tend to be formed in a {200} crystalline texture. Thus, the AFM layer 105, 205 may be initially formed with a {200} crystalline texture if the seed layer 102, 202 is formed with a {200} crystalline texture.

Thus an approach to forming a highly sensitive sensor is to form smooth seed layers having a {200} crystalline texture. Additional considerations for a seed layer include spin filtering and thermal stability. Thermal stability relates to the ability of a sensor to maintain adequate sensitivity after one or more anneal steps during manufacturing. Because of the various concerns involved (smoothness, {200} crystalline texture, spin filtering, thermal stability, etc.) a multilayered seed structure may be used. In a multilayered seed structure approach, individual layers may be used to address at least one of the designer's concerns. In one approach, shown in FIG. 3a, a multilayer seed structure 310 having a first insulating layer 311, a second insulating layer 312, and a third conducting layer 313, is formed. A fourth conducting layer 314 may be added as well. The first and second insulating layers 311, 312 are used to provide a {200} crystalline texture and adequate smoothness In one embodiment, the first insulating layer 311 is polycrystalline and the second insulating layer 312 is amorphous-like. For example, a polycrystalline oxide layer (e.g., NiO) may correspond to the first insulating layer 311 and an amorphous-like oxide layer (e.g., $NiMnO_x$) may correspond to the second insulating layer 312.

The third conducting layer 313 may be formed with a material having low electrical resistivity (e.g., Cu) to provide spin filtering. The fourth conducing layer 314, may be used to promote epitaxial growth of the ferromagnetic free layer 315 and should have the same or similar lattice spacing(s) or structure as the ferromagnetic free layer 315 to provide good lattice matching with the ferromagnetic free layer 315.

Note that the third and fourth conducting layers 313, 314 isolate the insulating layers 311, 312 from the ferromagnetic free layer 315. It has been observed that the insulating layers 311, 312 adversely affect the thermal stability of the sensor if allowed to come in contact with the ferromagnetic free layer 315. Thus having one or more conducting layers between the ferromagnetic free layer and insulating layer promotes the thermal stability of the sensor.

Figure 3A:
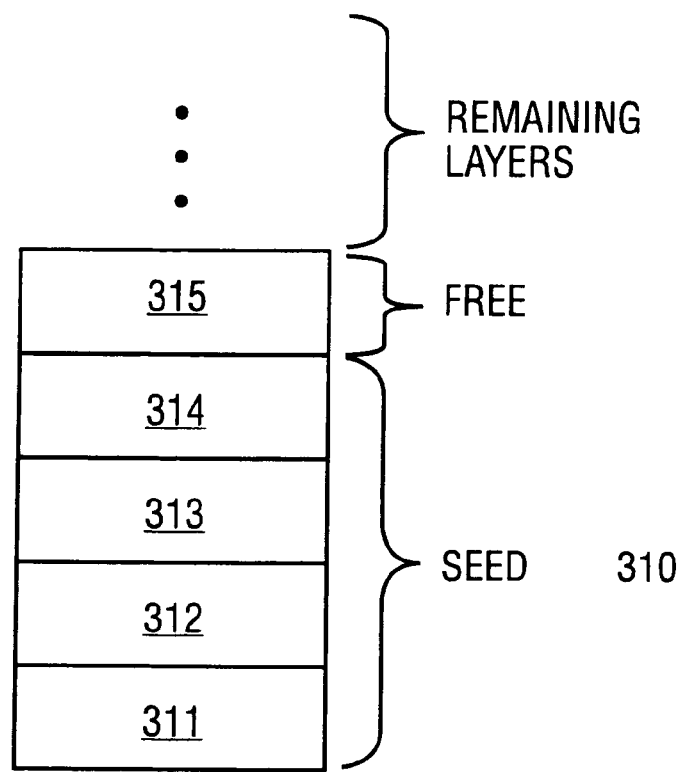
FIG. 3a shows a multilayered seed structure.
Figure 3B:
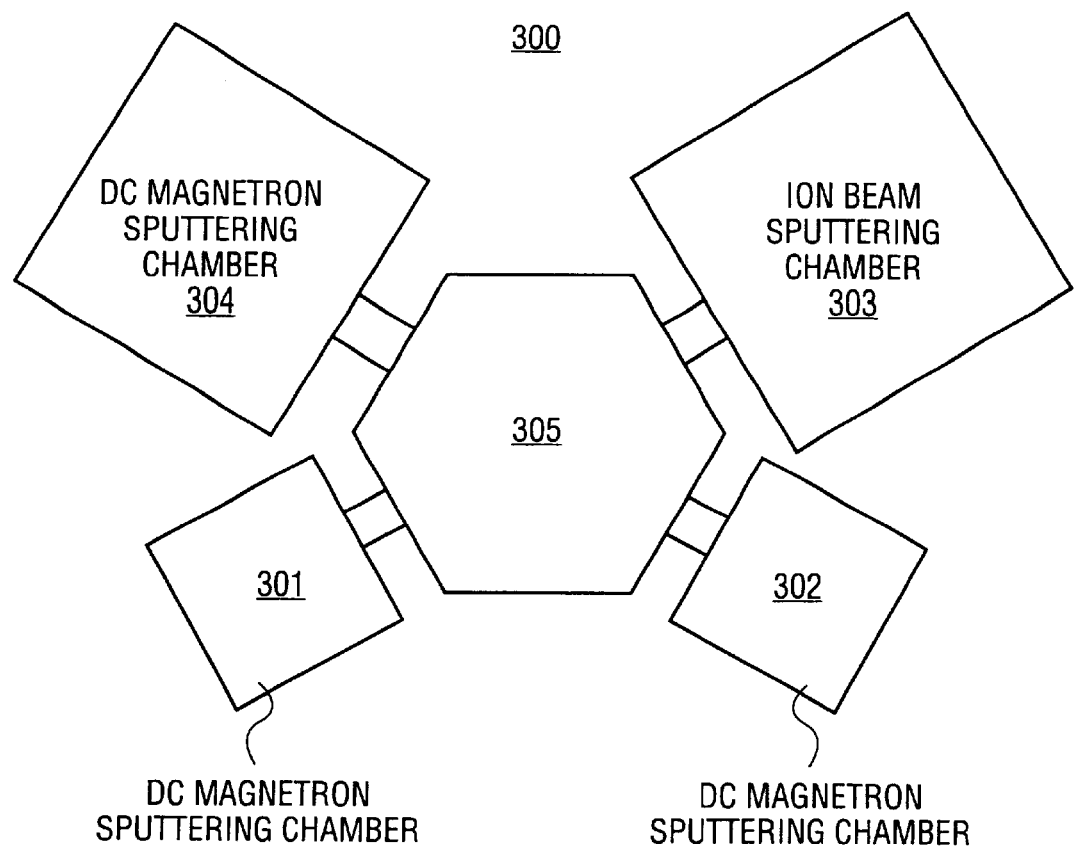
FIG. 3b shows a diagram of a manufacturing tool 300 that may be used to form a multilayered seed structure.

FIG. 3b shows a diagram of a manufacturing tool 300 that may be used to form the multilayered seed structure 102, 202 as well as the rest of the sensor 100, 200 as shown in FIGS. 1 and 2. The tool 300 has at least four chambers used for forming various layers associated with the sensors 100, 200 shown in FIGS. 1 and 2 and the seed layer 310 shown in FIG. 3a. Both the first and second chambers 301, 302 are DC magnetron sputtering chambers. The third chamber 303 is an ion beam sputtering chamber. The fourth chamber 304 is a third DC magnetron sputtering chamber. All four chambers 301 through 304 are coupled together by a transport module 305. Transport module 305 is used to transport a wafer having a plurality of sensors, during manufacturing, from chamber to chamber.

In an embodiment, the first two DC magnetron sputtering chambers 301, 302 are single target sputtering chambers while the ion beam and third DC magnetron sputtering chambers 303, 304 are multitarget sputtering chambers. The discussion below refers to such a tool 300 embodiment, however, note that multitarget chambers may be used for chambers 301, 302 to implement the method 400 shown in FIG. 4. Also, as an alternative embodiment (not shown in any Figure), different layers of a multilayered seed structure formed with reactively pulsed DC magnetron sputtering (e.g., NiO and $NiMnO_x$) may be formed in a single, multi-target DC magnetron sputtering chamber.

Figure 4:
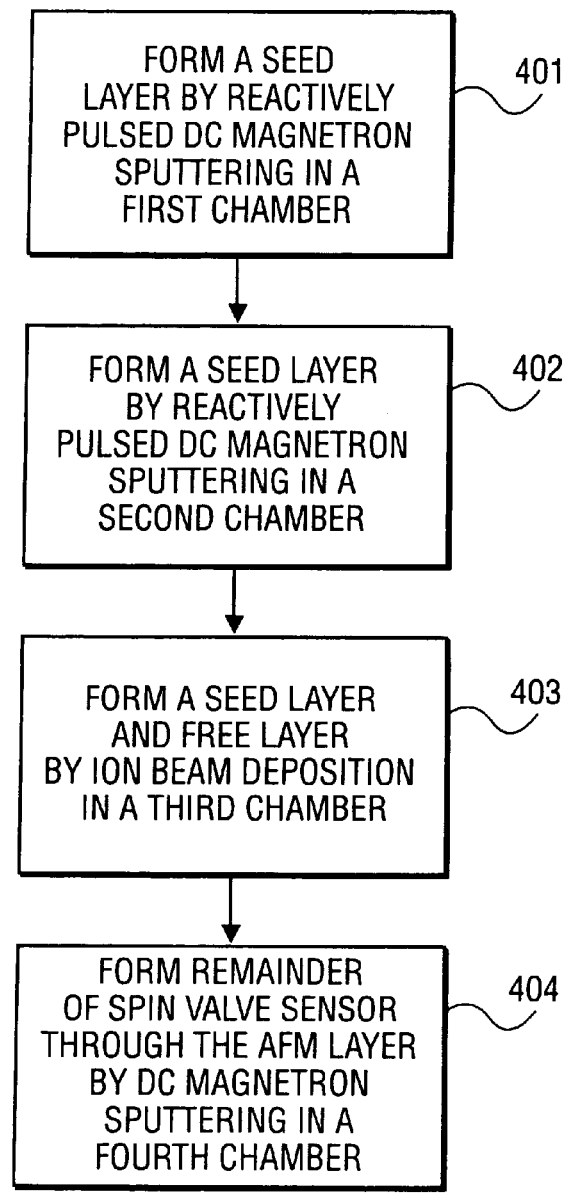
FIG. 4 shows a method 400 that may be used to form spin valve sensors with a multilayered seed structure.

FIG. 4 shows a method 400 that may be used to form sensors with a multilayered seed structure 310 such as $NiO/NiMnO_x/Cu$ seed layers corresponding to layers 311/312/313 of FIG. 3a. Referring to FIGS. 3a,b and 4, the first layer 311 of the seed layer structure 310 (e.g., NiO) is formed 401 in one of the single target DC magnetron sputtering chambers (e.g., chamber 301). After forming the insulating polycrystalline seed layer in a single target DC magnetron sputtering chamber 301, the insulating amorphous-like seed layer 312 (e.g., $NiMnO_x$) is formed 402 in the other single target DC magnetron sputtering chamber (e.g., chamber 302). Note this requires the wafer to move through the transport module 305 as the insulating polycrystalline seed layer is passed from the first chamber 301 to the second chamber 302.

After the insulating amorphous-like seed layer 312 is formed in the second chamber 302, the sensor structure is formed 403 up to the completion of the ferromagnetic free layer 315 within the multitarget ion beam sputtering chamber 303. For sensors having four seed layers, the third 313 and fourth 314 seed layers and the ferromagnetic free layer 315 are both formed 403 in the multitarget ion beam sputtering chamber 303. Since the ferromagnetic free layer 103, 203 is formed with ferromagnetic material(s) (such as Ni—Fe and/or Co—Fe) and the third 313 and fourth 314 seed layers are typically formed with metallic materials, different targets comprising the different employed materials should be used. Note that a multilayered ferromagnetic free layer structure 103, 203 is possible. An example includes an embodiment where the first ferromagnetic free layer material (that is formed upon the seed layer) is Ni—Fe and a second ferromagnetic free layer material (formed upon the Ni—Fe layer) is Co—Fe.

The combination of targets used to form the layers deposited in the ion beam sputtering chamber 303 (e.g., a Cu target, a Ni—Fe target and a Co—Fe target) should be fixed on a rotatable drum in the chamber 303 in such a manner that a particular target used for a particular layer may be effectively moved by rotating the drum towards the opening of a shutter in the chamber 303 for the deposition of its corresponding layer.

For a simple spin valve sensor such as sensor 100 of FIG. 1, after the ferromagnetic free layer 103 is formed 403 in the ion beam sputtering chamber 303, the spacer layer 119 is formed in the multitarget DC magnetron sputtering chamber 304. In a further embodiment, the remainder of the spin valve sensor including the pinned layer 104 and AFM layer 105 are formed 404 in the multitarget DC magnetron sputtering chamber 304. In one such further embodiment, the spacer layer 119 is Cu, the pinned layer 104 is Co and the AFM layer 105 is Ni—Mn. A cap material such as Ta may be formed over the AFM layer 105 in chamber 304 as well.

For a synthetic spin valve sensor such as sensor 200 of FIG. 2, after the ferromagnetic free layer 203 is formed 403 in the ion beam sputtering chamber 303, in another further embodiment; the spacer layer 204, AP1 layer 222, nonmagnetic layer 223, AP2 layer 221 and AFM layer 205 are all formed 404 in the multitarget DC magnetron sputtering chamber 304. In an embodiment; the spacer layer 204 is Cu, the AP1 layer 222 is Co, the nonmagnetic layer 223 is Ru, the AP2 layer 221 is Co and the AFM layer 105 is Ni—Mn. Again, a cap material such as Ta may be formed over the AFM layer 105 in chamber 304 as well.

Reviewing FIG. 4 to summarize then: 1) an insulating polycrystalline seed layer 311 is formed 401 in a first DC magnetron sputtering chamber 301; 2) an insulating amorphous-like seed layer 312 is formed 402 in a second DC magnetron sputtering chamber 302; 3) a conducting seed layer 313 and ferromagnetic free layer 315 are formed 403 in an ion beam sputtering chamber 303 (a fourth seed layer 314 may also be formed in the ion beam sputtering chamber 303); and 4) the spacer layer is then formed 404 in another DC magnetron sputtering chamber 304 (the remaining sensor structure up through the antiferromagnetic layer or cap layer may also be formed 404 in the other DC magnetron sputtering chamber 404). The following discussion provides more details concerning embodiments of the method 400 of FIG. 4.

In an embodiment, the first 311 and second 312 seed layers are insulating. The insulating seed layer 311 may also be polycrystalline and the insulating seed layer 312 may also be amorphous-like. The seed layer 313 may also be conductive and the fourth seed layer 314 may have a structure or lattice spacing similar to the ferromagnetic free layer 315 to promote epitaxial growth of the ferromagnetic free layer 315.

With respect to the deposition 401 of the first film, in an embodiment a NiO polycrystalline film is deposited within a first single target DC sputtering chamber 301 on an $Al_2O_3$ coated wafer with reactive pulsed-DC magnetron sputtering from a metallic Ni target in 1 mTorr of mixed argon and oxygen gases. An asymmetric bipolar pulsed DC power supply is used to provide alternating target voltages of opposite polarities such as alternating voltages of −200 and +50 V.

When a first voltage of a first negative polarity (e.g., −200 V) is applied to the Ni target, argon ions are accelerated into the Ni target with a sufficient kinetic energy to knock Ni atoms from the Ni target. The freed Ni atoms subsequently collide with oxygen when traveling in the plasma, forming a NiO film on the $Al_2O_3$ coated wafer. Note that a NiO film may also be deposited onto the Ni target, forming a capacitor between the Ni target and the plasma. If the first negative polarity voltage (e.g., −200 V) continues to be applied to the Ni target, current will eventually cease flowing through the NiO capacitor which will cease the sputtering activity. At this point, the target is "poisoned".

Sputtering may be continued if the polarity of the target voltage is reversed to a second voltage of positive polarity (e.g., from −200 to +50 V). When the second voltage of positive polarity is applied to the target, the NiO capacitor is charged to a positive polarity (e.g., +50 V) on the surface exposed to the plasma. When the voltage returns to the first polarity (e.g., −200 V), the voltage on the plasma side of the NiO capacitor remains at the first polarity (e.g., −250 V). With this extra energy, the NiO film is sputtered off from the Ni target, allowing for the sputtering to continue.

A reactively DC-pulsed sputtered NiO film as the initial seed layer provides a smooth interface on which the sensor grows. As discussed, sensor layers formed with reduced surface roughness (and high density) keep the ferromagnetic exchange-coupling field $H_F$ between the ferromagnetic free layer 103, 203 and the pinned layer 104, 220 small.

Figure 5:
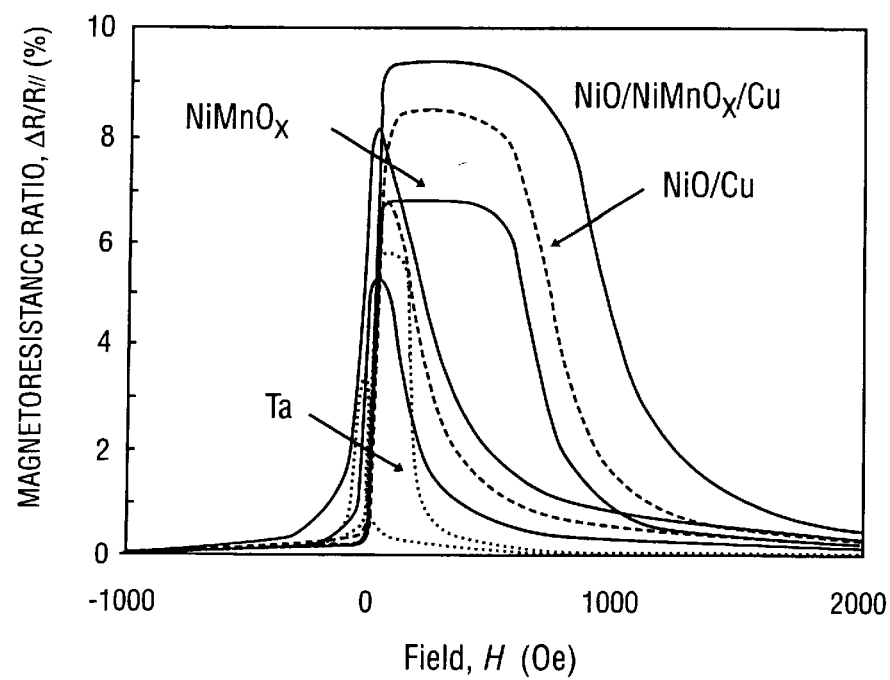
FIG. 5 shows MR responses of simple Ni—Mn spin valve sensors with various seed layers.

FIG. 5 and Table 1 show easy axis MR responses and GMR properties of simple spin valve sensors comprising seed layers/Ni—Fe(4.5)/Co—Fe(0.6)/Cu(2.4)/Co(3.2)/Ni—Mn(25)/Ta(6) films after anneal for 2 at 280° C. with a field of 800 Oe in a high vacuum oven, where the seed layers are Ta(3), $NiMnO_x$(3), NiO(33)/Cu(1.4) or NiO(33)/$NiMnO_x$(3)/Cu(1.4) films.

TABLE 1

Magnetic and GMR properties of simple Ni—Mn spin valve sensors with various seed layers.

| Properties | Ta | NiMnOx | NiO/Cu | NiO/NiMnOx/Cu |
|---|---|---|---|---|
| $H_F$ (Oe) | 7.4 | 11.2 | 25.6 | 2.7 |
| $H_{UA}$ (Oe) | 76 | 412 | 468 | 590 |
| $R_{//}$ (Ω/Y) | 19.8 | 18.2 | 17.0 | 16.9 |
| $\Delta R_G/R_{//}$ (%) | 5.8 | 6.8 | 8.5 | 9.4 |

Figure 6:
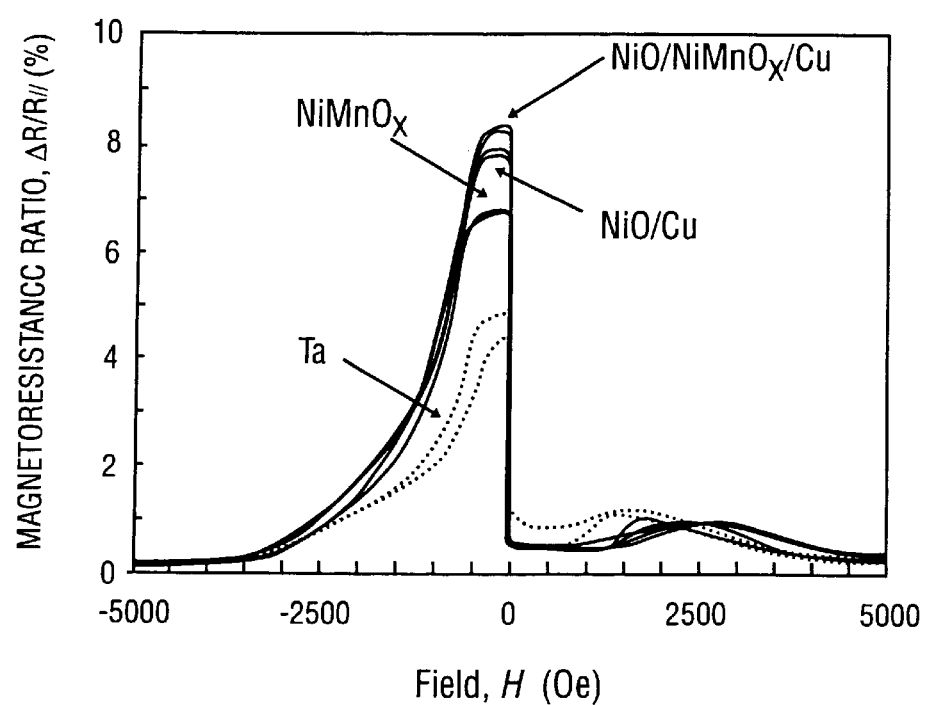
FIG. 6 shows MR responses of synthetic Ni—Mn spin valve sensors with various seed layers.

FIG. 6 and Table 2 show easy-axis MR responses and GMR properties of synthetic spin valve sensors comprising seed layers/Ni—Fe(4.5)/Co—Fe(0.6)/Cu(2.4)/Co(3.2)/Ru(0.8)/Co(3.2)/Ni—Mn(25)/Ta(6) films after anneal for 10 h at 260° C. with a field of 10 kOe in a high vacuum oven, where the seed layers are Ta(3), $NiMnO_x$(3), NiO(33)/Cu(1.4) or NiO(33)/$NiMnO_x$(3)/Cu(1.4) films. Both the simple and synthetic Ni—Mn spin valve sensors with the NiO/$NiMnO_x$/Cu seed layers exhibits magnetic and GMR properties far better than those of Ni—Mn spin valve sensors with other seed layers.

TABLE 2

Magnetic and GMR properties of synthetic Ni—Mn spin valve sensors with various seed layers.

| Properties | Ta | NiMnOx | NiO/Cu | NiO/NiMnOx/Cu |
|---|---|---|---|---|
| $H_F$ (Oe) | 3.2 | 5.5 | 20.6 | 5.6 |
| $H_{UA}$ (Oe) | 1735 | 1903 | 2206 | 2098 |
| $R_{//}$ (Ω/Y) | 18.7 | 16.2 | 15.2 | 15.3 |
| GMR (%) | 4.3 | 6.6 | 7.7 | 8.1 |

Figure 7:
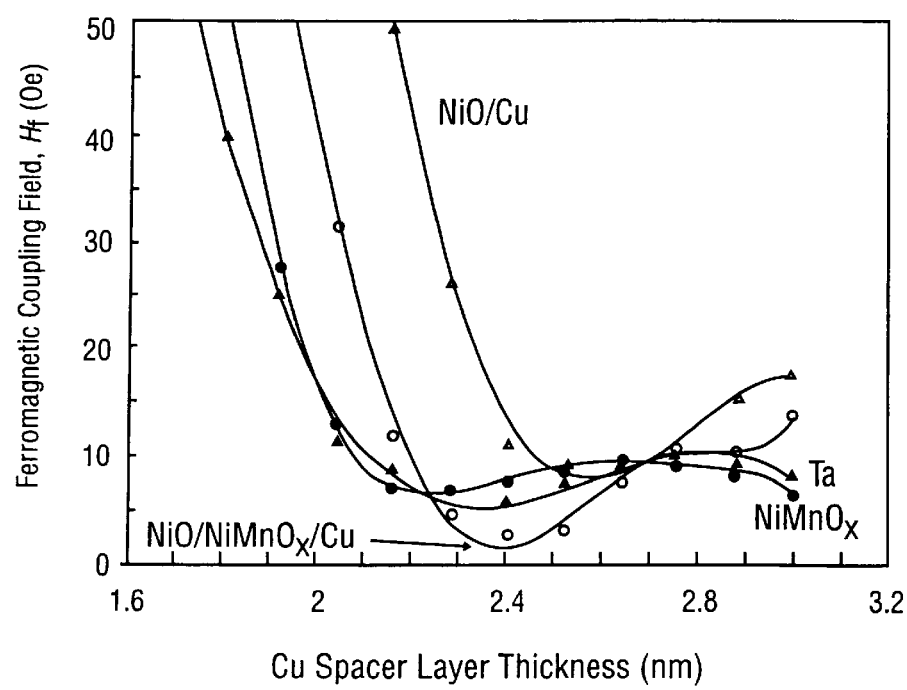
FIG. 7 shows $H_F$ vs. Cu spacer layer thickness for simple Ni—Mn spin valve sensors comprising seed layers/Ni—Fe (4.5)/Co—Fe(0.6)/Cu(2.4)/Co(3.2)/Ni—Mn(25)/Ta(6)

FIGS. 7 and 8 show $H_F$ and $\Delta R_G/R_{//}$, respectively, vs. Cu spacer layer thickness for simple spin valve sensors comprising seed layers/Ni—Fe(4.5)/Co—Fe(0.6)/Cu/Co(3.2)/Ni—Mn(25)/Ta(6) films after anneal with a field of 800 Oe for 2 at 280° C., where the seed layers are Ta(3), $NiMnO_x$(3), NiO(33)/Cu(1.4) or NiO(33)/$NiMnO_x$(3)/Cu(1.4) films. The use of the NiO/$NiMnO_x$/Cu seed layers causes a substantial $H_F$ oscillation with the Cu spacer layer thickness, thereby leading to an $H_F$ of as low as 2.7 Oe when the Cu spacer layer is as thin as 2.4 nm. In addition, the simple Ni—Mn spin valve with the NiO/$NiMnO_x$/Cu seed layers exhibits a $\Delta R_G/R_{//}$ much higher than those with other seed layers.

FIG. 9 shows in-plane x-ray diffraction patterns of the simple Ni—Mn spin valve sensor with the Ta(3) seed layer before and after anneal. Before and after anneal, the Ni—Fe films exhibit a $\{220\}_{fcc}$ crystalline texture. Due to epitaxial growth, the Co—Fe, Cu, Co and Ni—Mn films deposited thereon also exhibit a $\{220\}_{fcc}$ crystalline texture. In addition, the Ni—Mn film also exhibits a weak $\{111\}_{fcc}$ crystalline texture. No phase transformation can be identified from these x-ray diffraction patterns.

FIG. 10 shows in-plane x-ray diffraction patterns of the simple Ni—Mn spin valve sensor with the NiO(33)/$NiMnO_x$(3)/Cu(1.4) seed layers before and after anneal, where the NiO film is deposited with reactive DC magnetron sputtering. Before anneal, the NiO film exhibits a strong $\{200\}_{fcc}$ crystalline texture, a weak $\{220\}_{fcc}$ crystalline textures, and an even weaker $\{111\}_{fcc}$ crystalline texture. Due to epitaxial growth, the Ni—Fe, Co—Fe, Cu, Co and Ni—Mn films deposited thereon also exhibit $\{200\}_{fcc}$, $\{220\}_{fcc}$ and $\{111\}_{fcc}$ crystalline textures. It should be noted that these films exhibit very weak $\{111\}_{fcc}$ crystalline textures. The strong peak shown at 42.8° in fact mainly comes from the NiO $\{002\}_{fcc}$ crystalline texture. This identification is confirmed from other x-ray diffraction patterns of similar spin valve sensors but with various NiO and Ni—Mn film thicknesses. After anneal, the Ni—Mn $\{200\}_{fcc}$ peak is split into $(200)_{fct}$, $(020)_{fct}$ and $(002)_{fct}$ peaks, while the Ni—Mn $\{220\}_{fcc}$ peak is also split into $(220)_{fct}$, $(202)_{fct}$ and $(022)_{fct}$ peaks. These findings indicate that the transformation from an fcc phase (a=0.3685 nm) to an fct phase (a=0.3727 nm and c=0.3581 nm) has occurred in the Ni—Mn film. This peak splitting indicates that a small amount of the fct phase nuclei may exist before anneal and it starts to grow from its original matrix during anneal. The existence of the fct phase before anneal is supported by the fact that the Co and Ni—Mn films have already exchange-coupled ($H_{UA} \approx 10$ Oe) before anneal.

It should be noted that if the NiO film is deposited with RF magnetron sputtering from a ceramic NiO target in an argon gas, instead of with reactive pulsed-DC magnetron sputtering, the NiO film only exhibits a strong $\{111\}_{fcc}$ crystalline texture.

Previously described experimental results indicate that the fabrication method of the simple and synthetic Ni—Mn spin valve sensors with the NiO/NiMnO$_x$/Cu seed layers leads to a low $H_F$, a high $H_{UA}$, a high GMR coefficient, and good soft magnetic properties of the ferromagnetic free layer.

The use of reactive DC-pulsed magnetron sputtering for the deposition of the NiO film causes the NiO film to exhibit a strong $\{002\}_{fcc}$ crystalline texture. Due to epitaxial growth, the Ni—Mn films also exhibit a $\{002\}_{fcc}$ crystalline textures. This Ni—Mn $\{002\}_{fcc}$ crystalline texture appears to play a crucial role in accelerating the phase transformation from the fcc phase to the fct phase and thus in attaining a high $H_{UA}$. In addition, as the NiO film thickness increases, the $(200)_{fct}$, $(020)_{fct}$, and $(002)_{fct}$ peak intensities of the Ni—Mn film have been found to increase, while $H_{UA}$ and $\Delta R_G/R_{//}$ has also been found to increase.

In contrast, if the NiO film is deposited with RF magnetron sputtering from a ceramic NiO target in an argon gas, it only exhibits a strong $\{111\}_{fcc}$ crystalline textures. The lack in the $\{200\}_{fcc}$ crystalline texture may cause difficulties in carrying out the phase transformation, thus leading to a low $H_{UA}$ and a low $\Delta R_G/R_{//}$.

The use of reactive DC-pulsed magnetron sputtering for the deposition of the NiMnO$_x$ film leads the NiMnO$_x$ film to provide an in-situ smooth surface. Due to this in-situ smooth surface, $H_F$ oscillates with the Cu spacer layer thickness, and an $H_F$ of as low as 2.7 Oe and a GMR coefficient of as high as 9.4% can be attained when the Cu spacer layer is as thin as 2.4 nm.

In contrast, if the NiMnO$_x$ film is exposed to air and the spin valve sensor films are deposited later, the resultant ex-situ surface does not lead to such good GMR properties.

The use of ion beam sputtering for the deposition of the Cu seed layer causes the Cu seed layer to provide in-situ protection for the ferromagnetic free layer from the deterioration of soft magnetic properties and thermal stability (resulting from to the direct contact between the insulating seed layer and the ferromagnetic free layer). For example, the use of the Cu seed layer substantially causes a reduction in a uniaxial anisotropy field ($H_K$) from 16 Oe to 7 Oe. This reduction will lead to an improvement in the permeability of the ferromagnetic free layer. In fact, DC magnetron sputtering can also be used for the deposition of the Cu seed layer for the same purposes. However, since the electrical resistivity of the ion beam sputtered Cu film (3.5 $\mu\Omega$-cm) is higher than that of DC magnetron sputtered Cu film (2.8 $\mu\Omega$-cm), ion beam sputtering is preferred to attain a high sensor resistance. More importantly, cycle time for the manufacture can be substantially reduced since there is no need in transporting the wafer from the ion beam chamber to the DC magnetron chamber, and then to the ion beam chamber.

The use of ion beam sputtering for the deposition of Ni—Fe and Co—Fe films causes the spin valve sensor to exhibit a low $H_F$. For example, the simple Ni—Mn spin valve sensor with ion beam sputtered Ni—Fe/Co—Fe films exhibits an $H_F$ of 2.7 Oe, while that with DC magnetron sputtered Ni—Fe/Co—Fe films exhibits an $H_F$ of beyond 10 Oe. The $H_F$ can even reach zero or slightly negative (indicating antiparallel ferromagnetic exchange-coupling across the Cu spacer layer) as the thickness of the ion beam sputtered Ni—Fe/Co—Fe films increases to 6 nm. Such a low $H_F$ is attained mainly due to the in-situ smooth surface and partially due to that ion beam sputtering provides a denser film with less pinholes than DC magnetron sputtering.

The use of DC magnetron sputtering for the deposition of the Cu spacer layer causes the Cu spacer layer to exhibit an electrical resistivity lower than the use of ion beam sputtering. This low electrical resistivity leads to a high GMR coefficient. For example, the Ni—Mn spin valve sensor with DC magnetron sputtered Cu spacer layer exhibit a $\Delta R_G/R_{//}$ of 9.4%, while Ni—Mn spin valve sensor with ion beam sputtered Cu spacer layer exhibits a $\Delta R_G/R_{//}$ of 8.2%.

The use of DC magnetron sputtering for the deposition of Co and Ni—Mn films causes the annealed Co/Ni—Mn films to exhibit an $H_{UA}$ of as high as 590 Oe. If the DC magnetron sputtered Co/Ni—Mn films are replaced by ion beam sputtered Co/Ni—Mn films, $H_{UA}$ is only around 450 Oe. This difference in $H_{UA}$ results from the fact that the DC magnetron sputtered Ni—Mn film has a Mn content less by ~1 at % than the Ni—Mn target, while the ion beam sputtered Ni—Mn film has a Mn content less by around ~3 at % than the Ni—Mn target.

The use of DC magnetron sputtering for the deposition of Co, Ru and Co films causes the Co/Ru/Co films to exhibit a high spin-flop saturation field ($H_S$) of ~6 kOe. If the DC magnetron sputtered Co/Ru/Co films are replaced by ion beam sputtered Co/Ru/Co films, $H_S$ is only around ~2 kOe.

Referring back to FIG. 4, note that the method 400 of FIG. 4 may be simplified to the method 1000 of FIG. 11 if two seed layers need not be formed by reactively pulsed DC magnetron in separate chambers. In the method 1000 of FIG. 11 a seed layer is formed 1001 by reactively pulsed DC magnetron sputtering in a first chamber. Then a seed layer and a ferromagnetic free layer are formed 1002 by ion beam sputtering in the third chamber. Then the remainder of a spin valve sensor through the AFM layer is formed 1003 by DC magnetron sputtering in the fourth chamber. The tool 300 shown in FIG. 3b may be used, however one of the DC magnetron sputtering chambers 301, 302 would not be used. Other tool designs may be used such as a tool having a single target DC magnetron sputtering chamber, a multitarget ion beam sputtering chamber and a multitarget DC magnetron sputtering chamber.

Alternative Embodiments

In the fabrication process of a spin valve head, a synthetic spin valve sensor comprising Al$_2$O$_3$(3)/Ni—Cr—Fe(3)/Ni—Fe(3)/Co—Fe(0.9)/Cu(2.4)/Co—Fe(0.8)/Ru (2.4)/Co—Fe(2)/Pt—Mn(22.5)/Ta(6) films (thickness in nm) is deposited in a manufacturing sputtering system comprising two loadlocks, one transportation module, two single-target DC magnetron sputtering chambers, one multitarget DC magnetron sputtering chamber and one multitarget ion beam sputtering chamber.

The $Al_2O_3$ film is deposited on an $Al_2O_3$ (used as a bottom read gap) coated wafer with reactive pulsed-DC magnetron sputtering from a metallic Al target in 3 mTorr of mixed argon and oxygen gases in the first single-target DC sputtering module. An asymmetric bipolar pulsed DC power supply is used to provide target voltages of −200 and +50 V alternatively.

The Ni—Cr—Fe/Ni—Fe/Co—Fe films are then sequentially deposited in a xenon gas with a magnetic field of 40 Oe in the multitarget ion beam sputtering chamber. The Cu/Co—Fe/Ru/Co—Fe/Pt—Mn/Ta films are then sequentially deposited in an argon gas with a magnetic field of 40 Oe in the multitarget DC magnetron sputtering chamber. The synthetic spin valve sensor is annealed for 4 h at 260° C. in a magnetic field of 10 kOe in a high vacuum oven to develop exchange coupling between the Co—Fe and Pt—Mn films.

In contrast to the simple Ni—Mn spin valve sensor, the use of the $NiO/NiMnO_x/Cu$ seed layers does not improve the GMR properties of the simple Pt—Mn spin valve sensor. FIG. 12 and Table 3 show easy-axis MR responses and magnetic properties, respectively, of the simple Pt—Mn spin valve sensors comprising seed layers/Ni—Fe(4.5)/CoFe (0.6)/Cu(2.4)/Co(3.2)/Pt—Mn(22.5)/Ta(6) films after anneal for 4 h at 260° C. with a field of 800 Oe in a high vacuum oven, where the seed layers are Ta(3), $NiMnO_x(3)$ and $NiO(33)/NiMnO_x(3)/Cu(1.4)$ films. The simple Pt—Mn spin valve sensor with the Ta seed layer shows the best GMR properties. Since $H_{UA}$ can only reach ~500 Oe, this $H_{UA}$ must be amplified by utilizing the synthetic spin valve design.

TABLE 3

Magnetic and GMR properties of simple Pt—Mn spin valve sensors with various seed layers.

| Properties | Ta | NiMnOx | NiO/NiMnOx/Cu |
|---|---|---|---|
| $H_F$ (Oe) | 8.9 | 9.0 | 9.4 |
| $H_{UA}$ (Oe) | 422 | 335 | 322 |
| $R_{//}$ (Ω/Y) | 17.0 | 18.1 | 18.1 |
| GMR (%) | 8.8 | 5.2 | 7.2 |

FIG. 13 and Table 4 show easy-axis MR responses and magnetic properties of synthetic spin valve sensors comprising seed layers/Ni—Fe(3)/Co—Fe(0.9)/Cu(2)/Co(2.4)/Ru(0.8)/Co(2)/Pt—Mn(22.5)/Ta(6) films after anneal for 4 h at 260° C. with a field of 10 kOe in a high vacuum oven, where the seed layers are Ta(3), Ni—Cr—Fe(3), NiO(3)/Ni—Cr—Fe(3) and $Al_2O_3(3)$/Ni—Cr—Fe(3) films. The synthetic Pt—Mn spin valve sensor with the $Al_2O_3$/Ni—Cr—Fe seed layers exhibits magnetic and GMR properties far better than those of the Pt—Mn spin valve sensors with other seed layers. Hence, the combined uses of the reactively DC-pulsed sputtered $Al_2O_3$ and ion-beam sputtered Ni—Cr—Fe seed layers for a synthetic Pt—Mn spin valve sensor substantially improve its overall GMR properties through specular scattering and grain coarsening, respectively.

TABLE 4

Magnetic and GMR properties of synthetic Pt—Mn spin valve sensors with various seed layers.

| Properties | Ta | Ni—Cr—Fe | NiO/Ni—Cr—Fe | $Al_2O_3$/Ni—Cr—Fe |
|---|---|---|---|---|
| $H_F$ (Oe) | 9.0 | 3.3 | 44.3 | 3.9 |
| $H_{UA}$ (Oe) | 3637 | 3413 | 3610 | 3695 |
| $R_{//}$ (Ω/Y) | 16.3 | 17.5 | 20.3 | 15.4 |
| GMR (%) | 8.0 | 9.1 | 5.9 | 12.2 |

FIGS. 14 and 15 show $H_F$ and $\Delta R_G/R_{//}$, respectively, vs. Cu spacer layer thickness for synthetic spin valve sensors comprising seed layer/Ni—Fe(3)/Co—Fe(0.9)/Cu/Co(2.4)/Ru(0.8)/Co(2)/Pt—Mn(22.5)/Ta(6) films after anneal with a field of 10 kOe for 4 h at 260° C., where the seed layers comprise Ta(3), Ni—Cr—Fe(3), NiO(3)/Ni—Cr—Fe(3) and $Al_2O_3(3)$/Ni—Cr—Fe(3) films. The use of the $Al_2O_3$/Ni—Cr—Fe seed layers causes a substantial $H_F$ oscillation with the Cu spacer layer thickness, thereby leading to an $H_F$ of as low as 3.9 Oe when the Cu spacer layer is as thin as 2 nm. In addition, the synthetic Pt—Mn spin valve with the $Al_2O_3$/Ni—Cr—Fe seed layers exhibits a $\Delta R_G/R_{//}$ of as high as 12.2%, much higher than those with other seed layers.

FIG. 16 shows in-plane x-ray diffraction patterns of the simple Pt—Mn spin valve sensor with the Ta seed layer before and after anneal. Before anneal, the Pt—Mn film exhibits a strong {220} crystalline texture. After anneal, the Pt—Mn film exhibits a strong $\{111\}_{fcc}$ crystalline textures and many other crystalline textures. Even without a Pt—Mn $\{200\}_{fcc}$ peak before anneal, Pt—Mn $(200)_{fct}$, $(020)_{fct}$ and $(002)_{fct}$ peaks appear after anneal. In addition, the Pt—Mn $\{220\}_{fcc}$ peak is split into Pt—Mn $(220)_{fct}$, $(202)_{fct}$ and $(022)_{fct}$ peaks after anneal. These findings indicate that the transformation from an fcc phase (a=0.3889 nm) to an fct phase (a=0.3997 nm and c=0.3703 nm) has occurred in the Pt—Mn film. The change from a strong $\{220\}_{fcc}$ crystalline texture to random crystalline textures after the phase transformation indicates that the fct phase may not exist before anneal and it prefers to nucleate and grow in its own way. The non-existence of the fct phase before anneal is supported by the fact that the Co—Fe and Pt—Mn films are not exchange-coupled at all ($H_{UA}$=0) before anneal.

In-plane x-ray diffraction patterns of the simple Pt—Mn spin valve sensors with other seed layers before and after anneal also show similar characteristics, except that the $\{111\}_{fcc}$ crystalline texture for the simple Pt—Mn spin valve sensor with the Ta seed layers is much more stronger than the simple Pt—Mn spin valves with other seed layers.

In-plane x-ray diffraction patterns of the synthetic Pt—Mn spin valve sensor before and after anneal show similar characteristics as the simple Pt—Mn spin valve sensor before and after anneal, i.e., random crystalline textures of the Pt—Mn film after anneal. However, the intensity of the $\{111\}_{fcc}$ crystalline texture is distinctly different when different seed layers are used. The use of the Ta seed layer leads to a strong $\{111\}_{fcc}$ crystalline texture. This $\{111\}_{fcc}$ crystalline texture substantially decreases when the NiO/Ni—Fe—Cr seed layers are used, and substantially increases when the $Al_2O_3$/Ni—Cr—Fe seed layers are used. Hence, it appears that a strong $\{111\}_{fcc}$ crystalline texture is needed to exhibit good GMR properties.

It should be noted that when the reactively DC-pulsed magnetron sputtered $Al_2O_3$ seed layer is exposed to air, and the Ni—Cr—Fe seed layer and other spin valve sensor films are deposited later, the GMR properties are only the same as the synthetic spin valve sensor with the Ni—Cr—Fe seed layer. Hence, it is crucial to maintain an in-situ smooth interface at the $Al_2O_3$ and Ni—Cr—Fe seed layers to exhibit the best GMR properties. This in-situ smooth interface is also needed to substantially reduce $H_F$.

The use of reactive DC-pulsed magnetron sputtering for the deposition of the $Al_2O_3$ film leads the $Al_2O_3$ film to provide an in-situ smooth surface. Due to this in-situ smooth surface, $H_F$ oscillates with the Cu spacer layer thickness, and an $H_F$ of as low as 3.9 Oe and a GMR coefficient of as high as 12.2% can be attained when the Cu spacer layer is as thin as 2 nm.

The reasons of each selected sputtering mode for each film are basically the same as the Ni—Mn spin valve sensor. The only difference is the use of the Co—Fe film, instead of the Co film as the pinned layer, since the $H_{UA}$ of Co—Fe/Pt—Mn films (450 Oe) have been to found to be higher than that of Co/Pt—Mn films (400 Oe).

What is claimed is:

1. A spin valve sensor, comprising:
   a) an $Al_2O_3$ seed layer;
   b) a Ni—Cr—Fe/Ni—Fe/CO—Fe multilayer structure over said $Al_2O_3$ layer;
   c) a Cu spacer layer over said multilayer structure;
   d) a Co—Fe/Ru/Co—Fe pinned layer over said Cu spacer layer; and
   e) a Pt—Mn antiferromagnetic layer over said pinned layer.

2. A spin valve sensor, comprising:
   an $Al_2O_3$ substrate;
   an $Al_2O_3$ seed layer over said substrate;
   a Ni—Cr—Fe/Ni—Fe/Co—Fe multilayer structure over said $Al_2O_3$ layer;
   a Cu spacer layer over said multilayer structure;
   a Co—Fe/Ru/Co—Fe pinned layer over said Cu spacer layer; and
   a Pt—Mn antiferromagnetic layer over said pinned layer.

3. The spin valve sensor of claim 2, wherein said $Al_2O_3$ substrate is a bottom read gap.

* * * * *